June 23, 1970 J. G. RICHER 3,517,215
COMPARATOR
Filed March 29, 1967
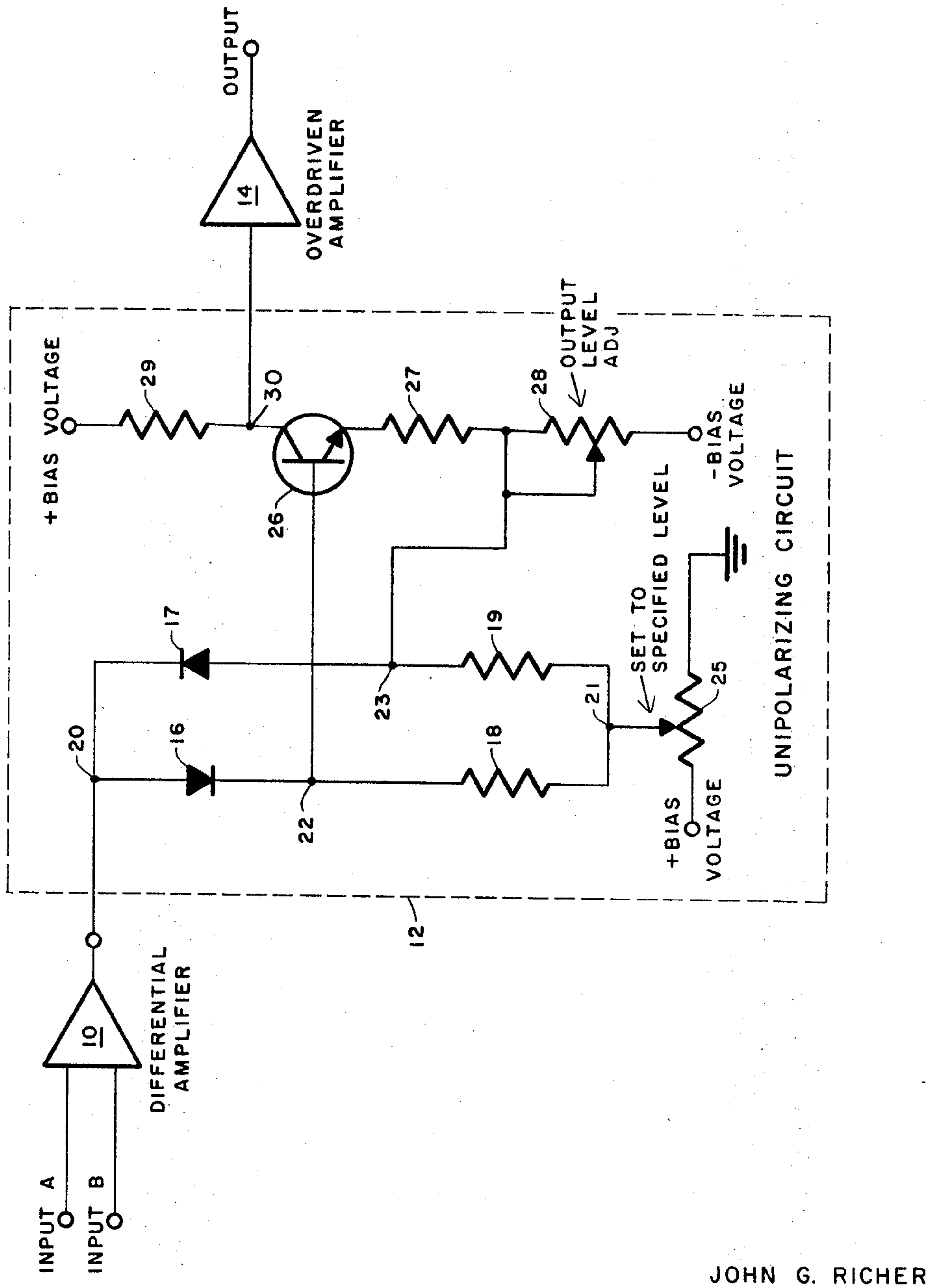
JOHN G. RICHER
*INVENTOR.*
BY J. M. St. Amand
*ATTORNEY*

United States Patent Office 3,517,215

Patented June 23, 1970

3,517,215

COMPARATOR

John G. Richer, Inyokern, Calif., assignor to the United States of America as represented by the Secretary of the Navy Filed Mar. 29, 1967, Ser. No. 627,592

Int. Cl. H03k 5/20

U.S. Cl. 307—235 1 Claim

ABSTRACT OF THE DISCLOSURE

A circuit for comparing two input signals with respect to each other, regardless of their absolute values. The signals are fed through a differential amplifier to a unipolarizing diode bridge circuit the output of which is fed to an overdriven amplifier for digitalizing the output. The unipolarizing circuit converts the bipolar output of the differential amplifier into a unipolar output by driving both the base and emitter of a transistor.

The invention herein described may be manufactured and used by or for the Government of the United States of America for governmental purposes without the payment of any royalties thereon or therefor.

Prior methods for comparing signals require a reference input, do not compare two input signals regardless of absolute value, or are phase sensitive.

The instant invention differentially amplifies two D.C. input signals on the basis of amplitude, unipolarizes the differential amplifier output and then provides a digital output either indicating equal or unequal amplitude input signals.

It is an object of the invention to compare two signals with respect to each other, regardless of their absolute amplitudes, within a given range of operation.

Other objects and many of the attendant advantages of this invention will become readily appreciated as the same becomes better understood by reference to the following detailed description when considered in connection with the accompanying drawing wherein;

The figure of drawing is a circuit diagram of a typical embodiment of the invention.

As shown in the drawing, a differential amplifier 10 has its output connected to unipolarizing circuit 12 whose output in turn is connected to overdriven amplifier 14. Overdriven amplifier 14 is merely an amplifier employed simply as a saturated amplifier. Differential amplifier 10 gives a specified output when the signal applied at each of its two inputs A and B has the same value. Where the signal at inpit A exceeds the signal at input B, the output of differential amplifier 10 will become more positive tnan the specified value, and conversely, if the signal value at input B exceeds the signal value at input A, the output will become more negative than the specified value. Unipolarizing cirruit 12 functions to convert the bipolar voltage changes at the output of differential amplifier 10 into a unipolar voltage which is fed to the input of overdriven amplifier 14. The output of overdriven amplifier 14 can be described as digital, either one value which indicates equal amplitude signals at inputs A and B of differential amplifier 10 or another value which indicates unequal amplitude input signals.

Unipolarizing circuit 12 consists of a diode bridge circuit comprised of diodes 16 and 17 and resistors 18 and 19 connected in conventional bridge circuit fashion. The output of differential amplifier 10 is fed to input terminal 20 of the diode bridge. Potentiometer 25, which is connected to a source of positive bias voltage, has its adjustable center arm connected to the other input terminal, 21, of the bridge for adjusting the threshold of the diodes at some specific desired value. The output of the diode bridge is taken from terminals 22 and 23. Terminal 22 is connected to the base of NPN transistor 26 and terminal 23 is connected to the emitter of transistor 26 via resistor 27; potentiometer 28 is used to adjust the output level. The collector of transistor 26 is connected to a positive bias voltage via limiting resistor 29. The output from transistor 26 is fed to overdriven amplifier 14.

Unipolarizing circuit 12 converts the bipolar output of differential amplifier 10 into a unipolar signal by driving both the base and the emitter of transistor 26. In other words, via the diode bridge the transistor base is driven by a diode rectified signal and the transistor emitter is driven by a diode rectified signal of the opposite polarity. When the output of differential amplifier varies either to the positive or negative side of the specified value set by potentiometer 25, the signal output of unipolarizing circuit 12 fed to overdriven amplifier 14 will be unipolar, varying only in one direction.

The comparator system of this invention operates as follows: Potentiometer 25 is set to some specified value. When a signal at the output of differential amplifier 10 (i.e., input at diode bridge terminal 20) is equal to the specified value set by potentiometer 25, neither of diodes 16 and 17 will conduct and the unipolarizing circuit output 30 will be at its maximum positive value, which is its "no error" value. If the signal at terminal 20 becomes more positive than the specified value, diode 16 will conduct putting a positive signal on the base of transistor 26, whereas, if the signal at terminal 20 becomes more negative than the specified value, diode 17 will conduct putting a negative signal on the emitter of transistor 26. The placing of a positive signal on the base or the placing of a negative signal on the emitter of an NPN transistor results in an increase of collector current, and a resulting voltage drop at point 30. This is the basis of the unipolarizing action. When the monopolarity signal at output 30 of the unipolarizing circuit is fed to overdriven amplifier 14, two discrete levels can be obtained, one indicating "no error" and the other indicating "error" signals.

Typical values for unipolarizing circuit components, for example, could be as follows: two IN914 diodes for diodes 16 and 17, two 510 ohm resistors for 18 and 19, a 1000 ohm potentiometer 25, a 2N697 transistor 26, 50 ohm resistor 27, 25K-ohm potentiometer 28, 1000 ohm resistor 29, and 16 volt positive or negative bias voltage.

Obviously many modifications and variations of the present invention are possible in the light of the above teachings. It is therefore to be understood that within the scope of the appended claims the invention may be practiced otherwise than as specifically described.

What is claimed is:

1. A comparator system for comparing two D.C. signals with respect to each other regardless of their absolute amplitudes values within a given range of operation, the system comprising:

(a) a differential amplifier means having separate inputs for receiving two signals to be compared, (b) said differential amplifier giving a specified output when each of said two input signals are equal, the differential amplifier output going more positive than said specified output when the value of the first of said two signals exceeds the second and conversely going more negative than said specified output when the second of said two signals exceeds the first, (c) a unipolarizing circuit means for converting the bipolar output of said differential amplifier into a unipolar voltage signal, (d) an overdriven amplifier means to which the unipolar signal from said unipolarizing circuit means is fed to provide a digitalized output, said overdriven amplifier having only two discrete output levels, one level indicating a difference in the amplitude of two input signals and the other level indicating no difference in the amplitude of said two input signals, (e) said unipolarizing circuit comprising:

(1) a two diode bridge circuit including oppositely polarized diodes and having means for adjusting the threshold of the diodes to the value of said other level output of said differential amplifier, (2) an NPN transistor circuit whose collector output is the unipolarizing circuit output fed to said overdriven amplifier, (3) the individual diodes of said diode bridge circuit being connected to the base and emitter respectively of said NPN transistor circuit such that when said two input signals are equal neither of the diodes of said bridge circuit will conduct and there will be no signal change at the collector of the NPN transistor resulting in said overdriven amplifier indicating no difference in said two input signals, (4) when the output of said differential amplifier becomes more positive than said specified value of one of the two diodes will conduct putting a positive signal on the base of the NPN transistor and when the output of said differential amplifier becomes more negative than the specified value the other of the two diodes will conduct putting a negative signal on the emitter of said transistor, whereby either of the positive and negative signals will cause a unipolar change in the transistor collector current resulting in a unipolar voltage signal fed to said overdriven amplifier for indicating a difference in said two input signals.

References Cited

UNITED STATES PATENTS

| | | | |
|---|---|---|---|
| 2,676,286 | 4/1954 | Buchner | 330—69 |
| 3,054,068 | 9/1962 | De Jong | 307—321 X |
| 3,289,007 | 11/1966 | Zydney | 328—26 |
| 3,292,098 | 12/1966 | Bensing | 307—262 |
| 3,299,287 | 1/1967 | Staeudle | 330—69 |
| 3,330,973 | 7/1967 | Clapper | 307—262 |

DONALD D. FORDER, Primary Examiner

H. A. DIXON, Assistant Examiner

U.S. Cl. X.R.

307—321